United States Patent
Hata et al.

(10) Patent No.: US 8,994,437 B2
(45) Date of Patent: Mar. 31, 2015

(54) SEMICONDUCTOR DEVICE AND CIRCUIT FOR CONTROLLING POTENTIAL OF GATE OF INSULATED GATE TYPE SWITCHING DEVICE

(75) Inventors: Keisuke Hata, Miyoshi (JP); Tsuneo Maebara, Nagoya (JP)

(73) Assignees: Toyota Jidosha Kabushiki Kaisha, Toyota (JP); Denso Corporation, Kariya (JP)

( * ) Notice: Subject to any disclaimer, the term of this patent is extended or adjusted under 35 U.S.C. 154(b) by 2 days.

(21) Appl. No.: 14/110,831

(22) PCT Filed: Feb. 14, 2012

(86) PCT No.: PCT/JP2012/053378
§ 371 (c)(1),
(2), (4) Date: Oct. 9, 2013

(87) PCT Pub. No.: WO2012/157301
PCT Pub. Date: Nov. 22, 2012

(65) Prior Publication Data
US 2014/0070869 A1    Mar. 13, 2014

(30) Foreign Application Priority Data

May 17, 2011 (JP) ................. 2011-110514

(51) Int. Cl.
*H03K 17/04* (2006.01)
*H02M 1/08* (2006.01)
*H03K 17/0412* (2006.01)

(52) U.S. Cl.
CPC ........... *H03K 17/04123* (2013.01); *H02M 1/08* (2013.01)

USPC .......................................... 327/376; 327/365

(58) Field of Classification Search
CPC . H03K 17/04123; H03K 17/725; F02P 3/053; F02P 11/00; F02D 41/1402
USPC .......................................... 327/365, 374–377
See application file for complete search history.

(56) References Cited

U.S. PATENT DOCUMENTS

| | | |
|---|---|---|
| 2006/0006432 A1 | 1/2006 | Shiraishi et al. |
| 2008/0265975 A1* | 10/2008 | Takasu et al. ................. 327/374 |
| 2009/0021294 A1 | 1/2009 | Morishita et al. |
| 2012/0212160 A1* | 8/2012 | Shindo et al. ................. 318/139 |

FOREIGN PATENT DOCUMENTS

| | | |
|---|---|---|
| EP | 1 881 587 A1 | 1/2008 |
| JP | A 2006-319711 | 11/2006 |
| JP | A 2006-320087 | 11/2006 |
| JP | A 2010-130557 | 6/2010 |

* cited by examiner

*Primary Examiner* — Diana J Cheng
(74) *Attorney, Agent, or Firm* — Oliff PLC (57) ABSTRACT

A semiconductor device outputs a signal to control a gate potential a switching device. The semiconductor device includes a first signal output terminal, and is capable of receiving or internally creating a reference signal, which varies between a first potential and a second potential. The semiconductor device can switch between first and second operations. The first operation outputs to the first signal output terminal a signal that is at a third potential when the reference signal is at the first potential, and that is at a fourth potential higher than the third potential when the reference signal is at the second potential. The second operation outputs to the first signal output terminal a signal that is at the fourth potential when the reference signal is at the first potential, and that is at the third potential when the reference signal is at the second potential.

1 Claim, 10 Drawing Sheets

SEMICONDUCTOR DEVICE AND CIRCUIT FOR CONTROLLING POTENTIAL OF GATE OF INSULATED GATE TYPE SWITCHING DEVICE

TECHNICAL FIELD

This application claims priority to Japanese Patent Application No. 2011-110514 filed on May 17, 2011. The entire content of this application is hereby incorporated by reference. A technique disclosed in the present specification relates to a semiconductor device for controlling a potential of a gate of an insulated gate type switching device (e.g., an IGBT, an FET, or the like), and a circuit including the semiconductor device.

BACKGROUND ART

Japanese Patent Application Publication No. 2010-130557 discloses a gate driving circuit for controlling a potential of a gate of an insulated gate type switching device. The gate driving circuit controls the potential of the gate of the insulated gate type switching device to cause the insulated gate type switching device to perform switching.

SUMMARY OF INVENTION

Problem to be Solved by the Invention

Figure 13:
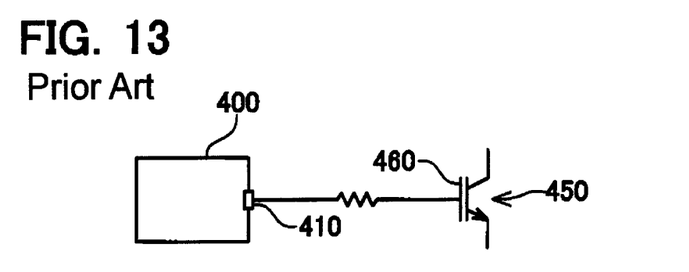
FIG. 13 is a circuit diagram showing a gate driving circuit for low-speed switching which uses a general semiconductor device 400 for controlling a potential of a gate of an insulated gate type switching device.

In recent years, a semiconductor device formed by integrating a gate driving circuit has been used. For example, a semiconductor device 400 shown in FIG. 13 is formed by integrating a gate driving circuit, and controls a potential of a gate 460 of an insulated gate type switching device 450. A signal output terminal 410 of the semiconductor device 400 is connected to the gate 460 of the insulated gate type switching device 450. The semiconductor device 400 outputs a signal to the signal output terminal 410, and the signal is input to the gate 460, whereby the insulated gate type switching device 450 performs switching. The gate driving circuit being integrated realizes downsizing of the gate driving circuit.

Generally, by sharply changing a potential of a gate of an insulated gate type switching device, the insulated gate type switching device can be caused to perform switching at a high speed. However, such a sharp change in the potential of the gate causes a high gate current flowing in a gate driving circuit. Therefore, the gate driving circuit that causes the insulated gate type switching device to perform switching at a high speed needs to have a high ampacity. However, due to a problem associated with heat generation or the like, it is difficult to make the above-described integrated gate driving circuit (i.e., the semiconductor device 400) have a high ampacity.

Figure 14:
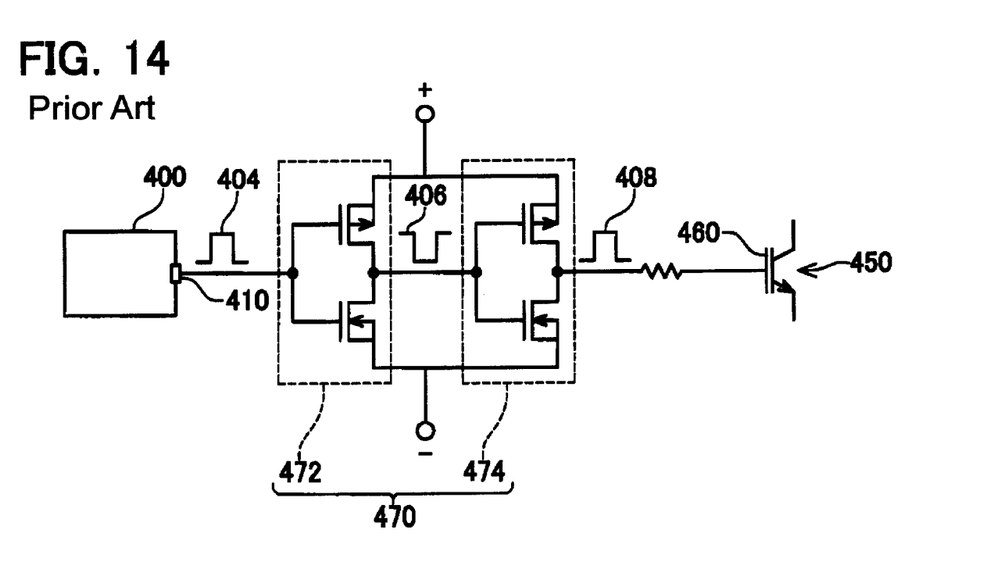
FIG. 14 is a circuit diagram showing an unpractical gate driving circuit for high-speed switching which uses the semiconductor device 400.

Therefore, when an attempt is made to configure a gate driving circuit for high-speed switching by using the above-described semiconductor device 400, a double-inverting circuit 470 needs to be provided between the semiconductor device 400 and the insulated gate type switching device 450 as shown in FIG. 14. The double-inverting circuit 470 includes: an inverting circuit 472 that inverts an output signal 404 of the semiconductor device 400, and outputs the inverted signal; and an inverting circuit 474 that inverts an output signal 406 of the inverting circuit 472, and outputs the inverted signal. Therefore, a signal 408 output from the inverting circuit 474 has the same phase as the signal 404 output from the semiconductor device 400. Accordingly, in this circuit, the signal 408 of the same phase as the signal 404 output from the semiconductor device 400 is input to the gate 460. Further, when the insulated gate type switching device 450 is caused to perform switching at a high speed, a high gate current flows in the inverting circuit 474. However, since each of switching devices included in the inverting circuit 474 is allowed to have a high ampacity, no problem occurs.

However, in the double-inverting circuit 470 shown in FIG. 14, although only the inverting circuit 474 is needed to secure the ampacity, the two inverting circuits are used in order to input, to the gate 460, the signal of the same phase as the signal output from the semiconductor device 400, and thereby the entirety of the gate driving circuit is unnecessarily made larger. Therefore, the circuit shown in FIG. 14 is not practical. For the above reasons, conventionally, the semiconductor device 400 configured for low-speed switching could not have been incorporated in the gate driving circuit for high-speed switching. Therefore, conventionally, a semiconductor device that outputs a signal for high-speed switching needed to be separately prepared, and incorporated in the gate driving circuit for high-speed switching. That is, a semiconductor device that outputs a signal to control a potential of a gate could not have been shared between low-speed switching and high-speed switching.

Particularly in a driving circuit for a motor, a DC-DC converter circuit that boosts a power supply voltage and an inverter circuit that converts DC into AC each use an insulated gate type switching device. The switching speed required of the insulated gate type switching device used in the inverter circuit is not so high, whereas high-speed switching is required of the insulated gate type switching device used in the DC-DC converter circuit. Conventionally, a gate driving circuit of the inverter circuit and a gate driving circuit of the DC-DC converter circuit used different semiconductor devices, and a shared use of a semiconductor device between these gate driving circuits has been strongly demanded.

Accordingly, the present specification provides a semiconductor device for controlling a potential of a gate of an insulated gate type switching device, which can be used for both low-speed switching and high-speed switching.

Solution to Problem

A semiconductor device disclosed in the present specification outputs a signal to control a potential of a gate of an insulated gate type switching device. The semiconductor device includes a first signal output terminal. The semiconductor device is capable of receiving a reference signal or internally creating the reference signal, which is configured to vary between a first potential and a second potential higher than the first potential. The semiconductor device is capable of switching between a first operation and a second operation. The first operation outputs to the first signal output terminal a signal that is at a third potential when the reference signal is at the first potential, and that is at a fourth potential higher than the third potential when the reference signal is at the second potential. The second operation outputs to the first signal output terminal a signal that is at the fourth potential when the reference signal is at the first potential, and that is at the third potential when the reference signal is at the second potential.

It is noted that the third potential may be the same as the first potential or the second potential, or different from these potentials. The fourth potential may be the same as the first potential or the second potential, or different from these potentials. A potential difference between the third potential and the fourth potential may be the same as or different from a potential difference between the first potential and the second potential. Further, the signal to control the potential of the gate of the insulated gate type switching device may be a signal directly input to the gate, or a signal that is an origin of a signal input to the gate. For example, in a case where a predetermined signal is subjected to processing such as inversion or amplification and the processed signal is input to the gate, the predetermined signal can be regarded as the signal to control the potential of the gate.

The semiconductor device, in the first operation, outputs a signal of the same phase as the reference signal. That is, the output signal is at a low potential (third potential) when the reference signal is at a low potential (first potential), and the output signal is at a high potential (fourth potential) when the reference signal is at a high potential (second potential). Further, the semiconductor device, in the second operation, outputs a signal obtained by inverting the reference signal. That is, the output signal is at a high potential (fourth potential) when the reference signal is at a low potential (first potential), and the output signal is at a low potential (third potential) when the reference signal is at a high potential (second potential). Therefore, the semiconductor device can be used as follows.

Figure 9:
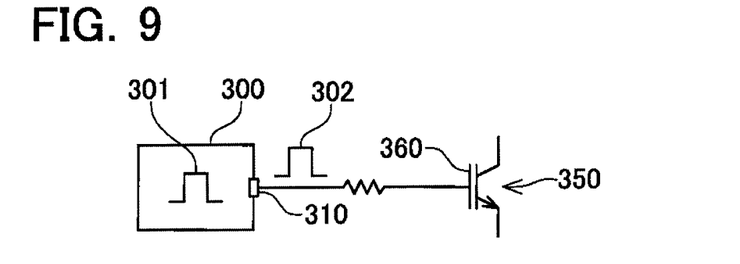
FIG. 9 is a circuit diagram showing an example of a gate driving circuit for low-speed switching which causes a semiconductor device 300 to perform the first operation.

FIG. 9 shows an example of a circuit structure in a case where an insulated gate type switching device 350 is caused to perform low-speed switching by causing a semiconductor device 300 to perform the first operation. In FIG. 9, a signal output terminal 310 of the semiconductor device 300 is connected to a gate 360 of the insulated gate type switching device 350. Further, in FIG. 9, since the semiconductor device 300 performs the first operation, a signal 302 of the same phase as a reference signal 301 is output to the signal output terminal 310. The signal 302 is input to the gate 360, and thereby the insulated gate type switching device 350 performs switching. Further, in FIG. 9, although a gate current of the insulated gate type switching device 350 flows in the semiconductor device 300, since the gate current is not so high during the low-speed switching, the ampacity of the semiconductor device 300 is enough for the gate current.

Figure 10:
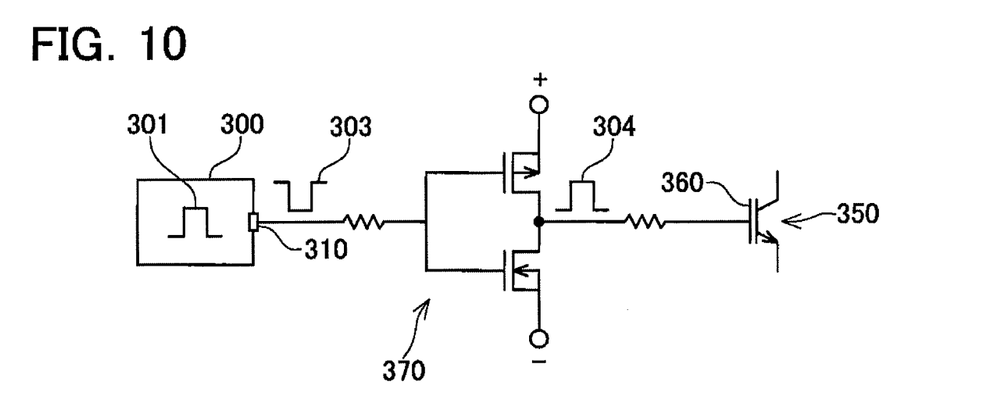
FIG. 10 is a circuit diagram showing an example of a gate driving circuit for high-speed switching which causes the semiconductor device 300 to perform the second operation.

FIG. 10 shows an example of a circuit structure in a case where the insulated gate type switching device 350 is caused to perform high-speed switching by causing the semiconductor device 300 to perform the second operation. In FIG. 10, the signal output terminal 310 of the semiconductor device 300 is connected to the gate 360 of the insulated gate type switching device 350 via an inverting circuit 370. It is noted that the ampacity of each of switching devices in the inverting circuit 370 is sufficiently large. In FIG. 10, since the semiconductor device 300 performs the second operation, the semiconductor device 300 outputs a signal 303 obtained by inverting the reference signal 301. The inverting circuit 370 outputs a signal 304 obtained by inverting the signal 303 output from the semiconductor device 300. Accordingly, the signal 304 output from the inverting circuit 370 is of the same phase as the reference signal 301. When the signal 304 output from the inverting circuit 370 is input to the gate 360, the insulated gate type switching device 350 performs switching. In this way, also in the circuit shown in FIG. 10, like in the circuit shown in FIG. 9, the insulated gate type switching device 350 can be caused to perform switching by using the signal of the same phase as the reference signal 301. Further, since the circuit shown in FIG. 10 causes the insulated gate type switching device 350 to perform high-speed switching, a high gate current flows in the inverting circuit 370. However, since the ampacity of each of the switching devices in the inverting circuit 370 is large, such a high gate current causes no problem. As described above, the circuit shown in FIG. 10 is capable of causing the insulated gate type switching device 350 to appropriately perform high-speed switching. Further, the circuit shown in FIG. 10 includes only one inverting circuit. Since an extra inverting circuit like that included in the circuit shown in FIG. 14 can be dispensed with, the circuit shown in FIG. 10 can be downsized as compared to the circuit shown in FIG. 14. That is, the circuit shown in FIG. 10 can be configured so as to have a practical size.

As described above, the semiconductor device 300 can be also used for a circuit for high-speed switching by only adding a minimum inverting circuit required for securing the ampacity. That is, the semiconductor device 300 can be shared between the circuit for low-speed switching and the circuit for high-speed switching.

Figure 11:
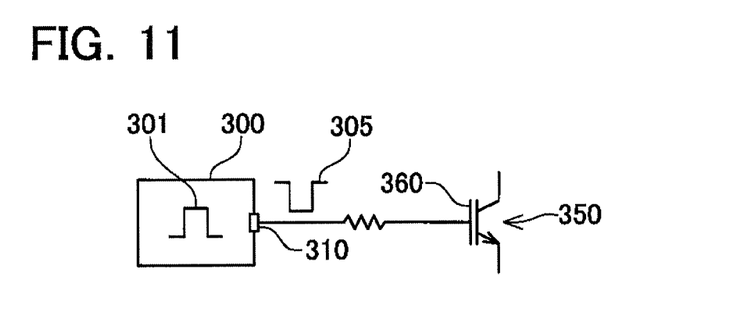
FIG. 11 is a circuit diagram showing an example of a gate driving circuit for low-speed switching which causes the semiconductor device 300 to perform the second operation.
Figure 12:
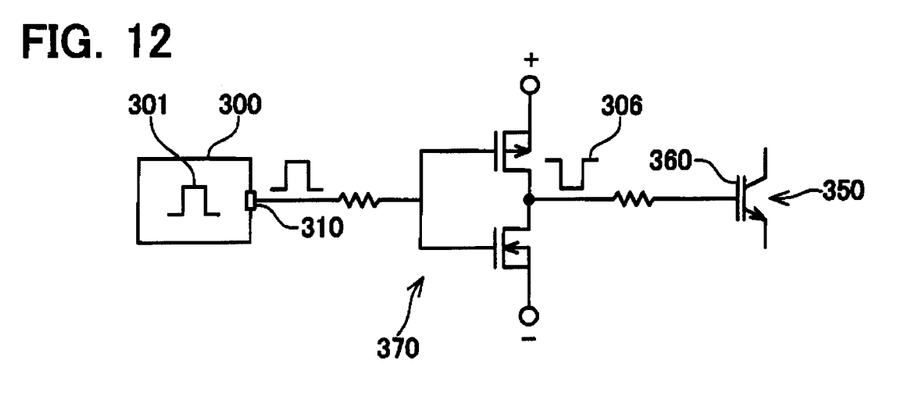
FIG. 12 is a circuit diagram showing an example of a gate driving circuit for high-speed switching which causes the semiconductor device 300 to perform the first operation.

While the structure to input to the gate a signal of the same phase as the reference signal 301 has been described with reference to FIGS. 9 and 10, the above-described semiconductor device may be used so as to input to the gate a signal obtained by inverting the reference signal 301. For example, as shown in FIG. 11, when the semiconductor device 300 is caused to perform the second operation in the circuit for low-speed switching, a signal 305 obtained by inverting the reference signal 301 is input to the gate 360. Further, as shown in FIG. 12, when the semiconductor device 300 is caused to perform the first operation in the circuit for high-speed switching, a signal 306 obtained by inverting the reference signal 301 is input to the gate 360. Thus, also when the semiconductor device 300 is used as shown in FIGS. 11 and 12, the semiconductor device 300 can be shared between the circuit for low-speed switching and the circuit for high-speed switching. It is noted that although the techniques disclosed in the present specification have been described with reference to FIGS. 9 to 12, FIGS. 9 to 12 merely show examples of the techniques disclosed in the present specification.

Further, the present specification provides a circuit using the above-described semiconductor device. This circuit controls a potential of a gate of an insulated gate type switching device. This circuit includes the above-described semiconductor device, an inverting circuit, and a first insulated gate type switching device. The inverting circuit is connected to a first signal output terminal of the semiconductor device, and is configured to invert a signal output to the first signal output terminal, and to output the inverted signal. The first insulated gate type switching device includes a gate that is connected to the inverting circuit, and receives, at the gate, the inverted signal output from the inverting circuit. The semiconductor device includes a first signal creating circuit configured to create the signal to be output to the first signal output terminal. The semiconductor device is set to work under only one of the first operation or the second operation. The first signal creating circuit includes a first switching device, the inverting circuit includes a second switching device, and an ampacity of the second switching device is larger than an ampacity of the first switching device.

According to the above-described circuit, it is possible to cause the first insulated gate type switching device to perform switching at a high speed.

Preferably, the above-described circuit further may include a low potential wiring being at a potential lower than an average potential of the signal output from the inverting circuit, a third switching device connected between a gate of the first insulated gate type switching device and the low potential wiring, and a second insulated gate type switching device connected to the first insulated gate type switching device in series. Preferably, the semiconductor device may include a second signal output terminal connected to the third switching device, and a second signal creating circuit configured to create a signal to be output to the second signal output terminal. Preferably, the third switching device may be configured to perform switching according to the signal output to the second signal output terminal. Preferably, the second signal creating circuit may include a fourth switching device, and is configured to create the signal so that the third switching device is turned on at least at a moment when the second insulated gate type switching device switches from off to on. Preferably, an ampacity of the third switching device may be larger than an ampacity of the fourth switching device.

According to the above-described configuration, since the third switching device is turned on at the moment when the second insulated gate type switching device switches from off to on, the gate of the first insulated gate type switching device is connected to the low potential wiring. Thereby, a potential rise due to turn-on of the second insulated gate type switching device is prevented from occurring at the gate of the first insulated gate type switching device. Thus, erroneous turn-on of the first insulated gate type switching device can be prevented. Further, in the circuit for high-speed switching, although the current that flows in the third switching device for preventing erroneous turn-on is high, since the third switching device has a large ampacity, no problem will occur.

DESCRIPTION OF EMBODIMENTS

Figure 1:
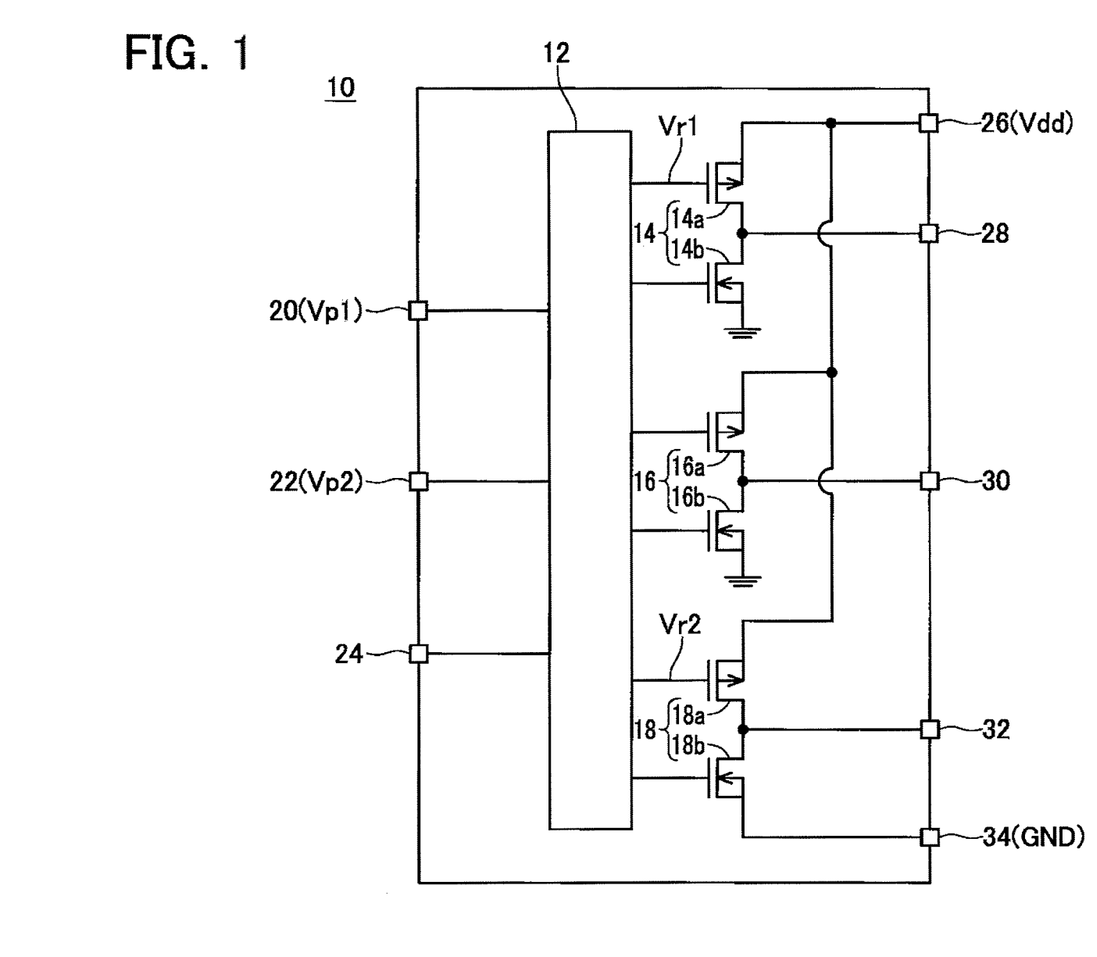
FIG. 1 is a circuit diagram showing a schematic internal structure of a semiconductor device 10.
Figure 4:
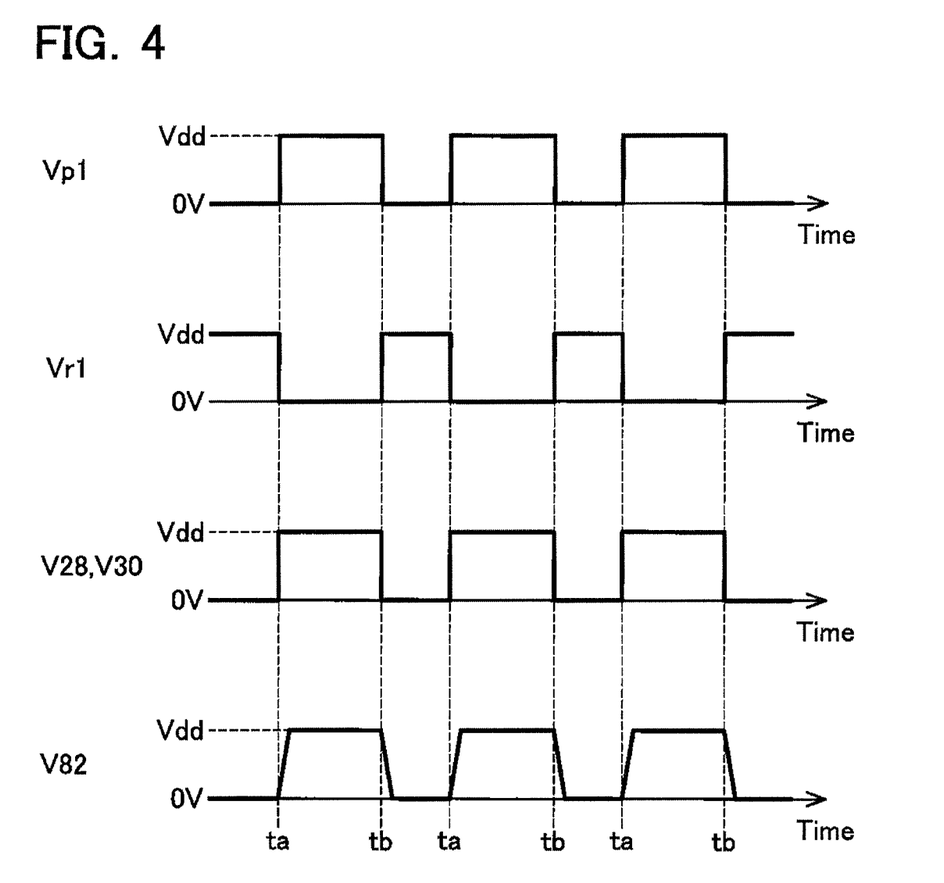
FIG. 4 is a graph showing potentials of components of the semiconductor device 10, and a potential V82 of a gate 82 in the gate driving circuit for low-speed switching, in a case where the semiconductor device 10 performs a first operation.

A semiconductor device 10 shown in FIG. 1 is, when it is used, connected to a gate of an IGBT in a DC-DC converter circuit or an inverter circuit. The semiconductor device 10 outputs a signal to control a potential of the gate of the IGBT. The semiconductor device 10 includes a logic circuit 12, inverting circuits 14 to 18, and terminals 20 to 34. A PWM signal Vp1 is input to the terminal 20. As shown in FIG. 4, the PWM signal Vp1 is a pulse signal that varies between a potential Vdd and 0V. A waveform (duty ratio or the like) of the PWM signal Vp1 is changed according to the operating state of the DC-DC converter circuit or the inverter circuit. The PWM signal Vp1 is created by an external circuit, and input to the terminal 20. A PWM signal Vp2 for an IGBT other than the IGBT as a target to be controlled by the semiconductor device 10 is input to the terminal 22. The terminal 24 is a terminal connected to a fixed potential. The operation of the logic circuit 12 is switched depending on whether the terminal 24 is connected to a potential higher than a predetermined potential, or the terminal 22 is connected to a potential equal to or lower than the predetermined potential. The terminal 26 is connected to the potential Vdd. The terminals 28 to 32 are output terminals of the inverting circuits 14 to 18, respectively. The terminal 34 is connected to the ground. Further, the semiconductor device 10 includes many terminals in addition to the terminals 20 to 34. For example, various signals indicating the controlled states of the DC-DC converter circuit and the inverter circuit are input to the terminals that are not shown.

The inverting circuit 14 includes a PMOS 14a and an NMOS 14b. A source of the PMOS 14a is connected to the terminal 26 (i.e., the potential Vdd). A drain of the PMOS 14a and a drain of the NMOS 14b are connected to the terminal 28. A source of the NMOS 14b is connected to the ground (i.e., the terminal 34). A gate of the PMOS 14a and a gate of the NMOS 14b are connected to the logic circuit 12.

The inverting circuit 16 includes a PMOS 16a and an NMOS 16b. A source of the PMOS 16a is connected to the terminal 26 (i.e., the potential Vdd). A drain of the PMOS 16a and a drain of the NMOS 16b are connected to the terminal 30. A source of the NMOS 16b is connected to the ground (i.e., the terminal 34). A gate of the PMOS 16a and a gate of the NMOS 16b are connected to the logic circuit 12.

The inverting circuit 18 includes a PMOS 18a and an NMOS 18b. A source of the PMOS 18a is connected to the terminal 26 (i.e., potential Vdd). A drain of the PMOS 18a and a drain of the NMOS 18b are connected to the terminal 32. A source of the NMOS 18b is connected to the terminal 34 (i.e., the ground). A gate of the PMOS 18a and a gate of the NMOS 18b are connected to the logic circuit 12.

Next, an operation of the semiconductor device 10 will be described. Hereinafter, an operation when the terminal 24 is connected to a potential higher than the above-described predetermined potential (hereinafter referred to as a first operation) and an operation when the terminal 24 is connected to a potential equal to or lower than the predetermined potential (hereinafter referred to as a second operation) will be separately described.

The logic circuit 12 inputs a signal Vr1 to each of the gates of the PMOS 14a, the NMOS 14b, the PMOS 16a, and the NMOS 16b, based on the PWM signal Vp1 input to the terminal 20. In the first operation, as shown in FIG. 4, the logic circuit 12 outputs, as the signal Vr1, a signal obtained by inverting the PWM signal Vp1. When the signal Vr1 is at the potential Vdd, the PMOS 14a is off and the NMOS 14b is on. Therefore, a potential V28 of the terminal 28 is 0V. On the other hand, when the signal Vr1 is at 0V, the PMOS 14a is on and the NMOS 14b is off. Therefore, the potential V28 of the terminal 28 is the potential Vdd. Accordingly, as shown in FIG. 4, the signal V28 output to the terminal 28 is a signal obtained by inverting the signal Vr1. As a result, the signal V28 has the same waveform as the PWM signal Vp1. Further, the inverting circuit 16 operates in a similar manner to the inverting circuit 14. That is, a signal V30 output to the terminal 30 is a signal obtained by inverting the signal Vr1. As a result, the signal V30 output to the terminal 30 has the same waveform as the PWM signal Vp1.

Figure 5:
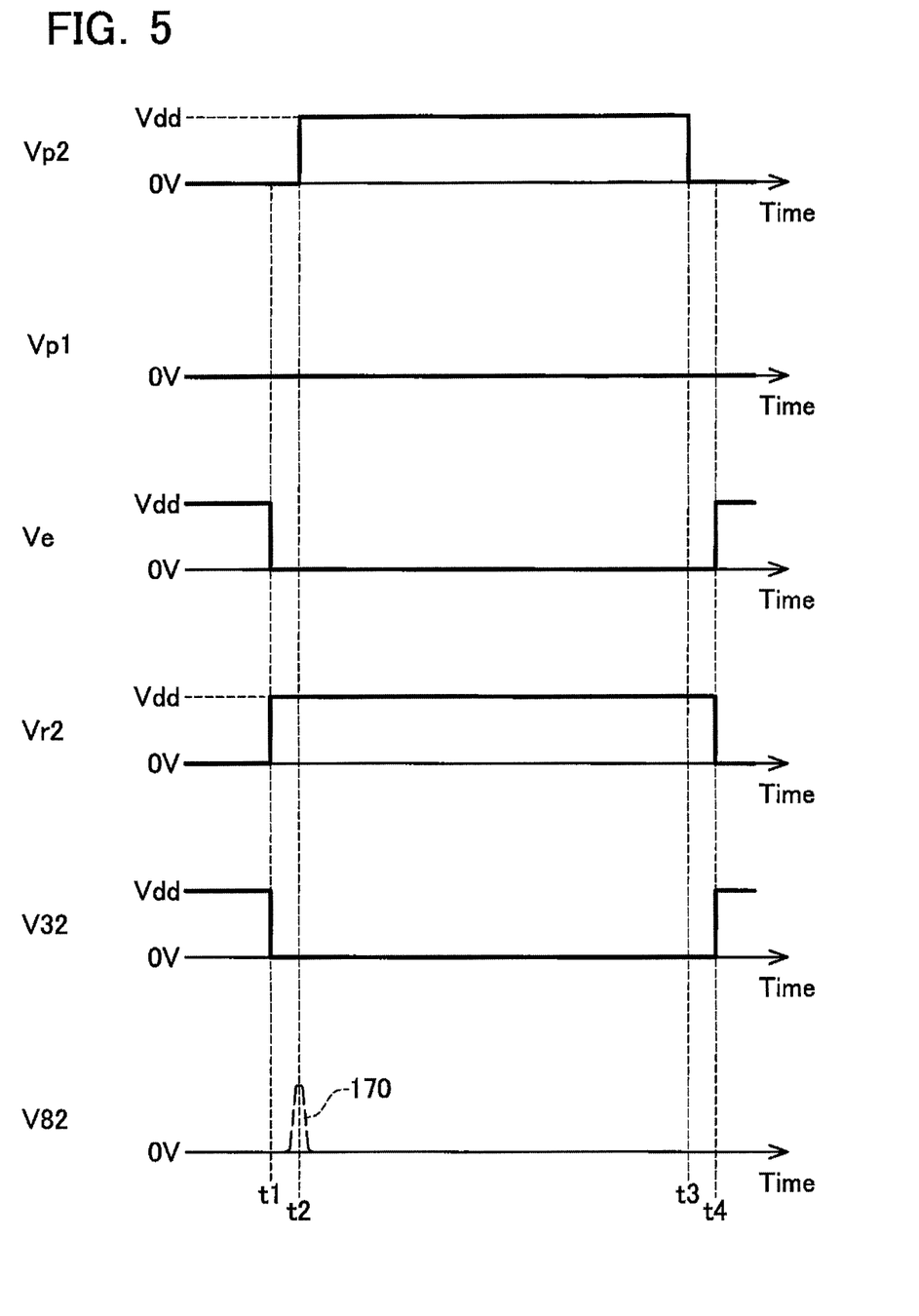
FIG. 5 is a graph showing potentials of components of the semiconductor device 10, a PWM signal Vp2 of an upper-arm IGBT 90, and a potential V82 of the gate 82 in the gate driving circuit for low-speed switching, in the case where the semiconductor device 10 performs the first operation.

Further, the logic circuit 12 creates an erroneous turn-on preventing signal Ve based on the PWM signals Vp1 and Vp2 respectively input to the terminals 20 and 22, the signals (input to the terminals that are not shown) indicating the controlled states of the circuits (the DC-DC converter circuit or the inverter circuit) connected to the semiconductor device 10, or the like. As shown in FIG. 5, the erroneous turn-on preventing signal Ve is a signal which drops from the potential Vdd to 0V at a timing t1 immediately before a timing t2 at which the PWM signal Vp2 rises from 0V to the potential Vdd, and rises from 0V to the potential Vdd at a timing t4 immediately after a timing t3 at which the PWM signal Vp2 drops from the potential Vdd to 0V. The logic circuit 12 inputs a signal Vr2 to each of the gates of the PMOS 18a and the NMOS 18b, based on the erroneous turn-on preventing signal Ve. In the first operation, the logic circuit 12 outputs, as the signal Vr2, a signal obtained by inverting the erroneous turn-on preventing signal Ve. When the signal Vr2 is at the potential Vdd, the PMOS 18a is off and the NMOS 18b is on. Therefore, a potential V32 of the terminal 32 is 0V. On the other hand, when the signal Vr2 is at 0V, the PMOS 18a is on and the NMOS 18b is off. Therefore, the potential V32 of the terminal 32 is the potential Vdd. That is, the signal V32 output to the terminal 32 is a signal obtained by inverting the signal Vr2. As a result, the signal V32 output to the terminal 32 has the same waveform as the erroneous turn-on preventing signal Ve.

Figure 7:
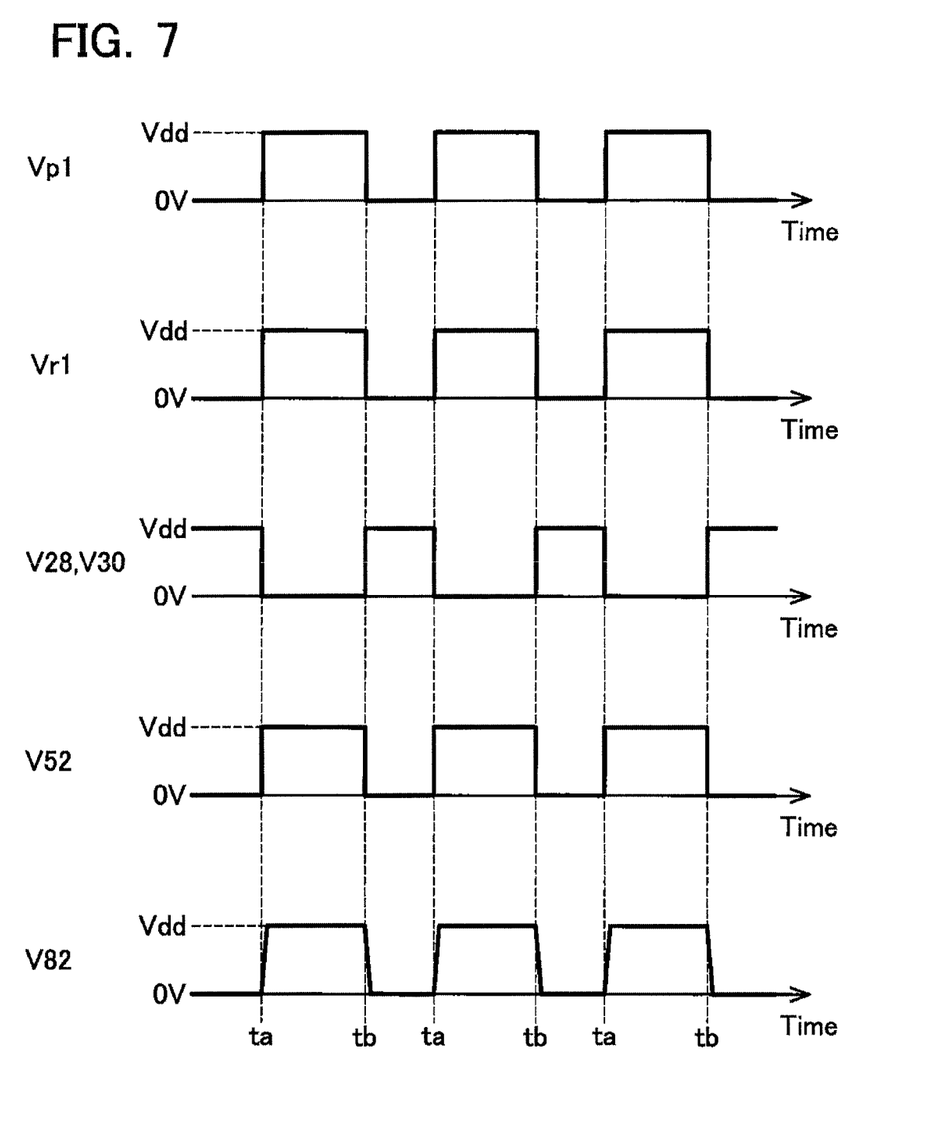
FIG. 7 is a graph showing potentials of components of the semiconductor device 10, a potential V52 in the gate driving circuit for high-speed switching, and a potential V82 of the gate 82, in a case where the semiconductor device 10 performs a second operation.

On the other hand, in the second operation, the logic circuit 12 inputs the PWM signal Vp1 as it is to each of the gates of the PMOS 14a, the NMOS 14b, the PMOS 16a, and the NMOS 16b. Accordingly, in the second operation, as shown in FIG. 7, the signal Vr1 has the same waveform as the PWM signal Vp1. Since the inverting circuit 14 inverts the input signal Vr1 and outputs the inverted signal to the terminal 28, the signal V28 output to the terminal 28 is a signal obtained by inverting the PWM signal Vp1. Likewise, since the inverting circuit 16 inverts the input signal Vr2 and outputs the inverted signal to the terminal 30, the signal V30 output to the terminal 30 is a signal obtained by inverting the PWM signal Vp1.

Figure 8:
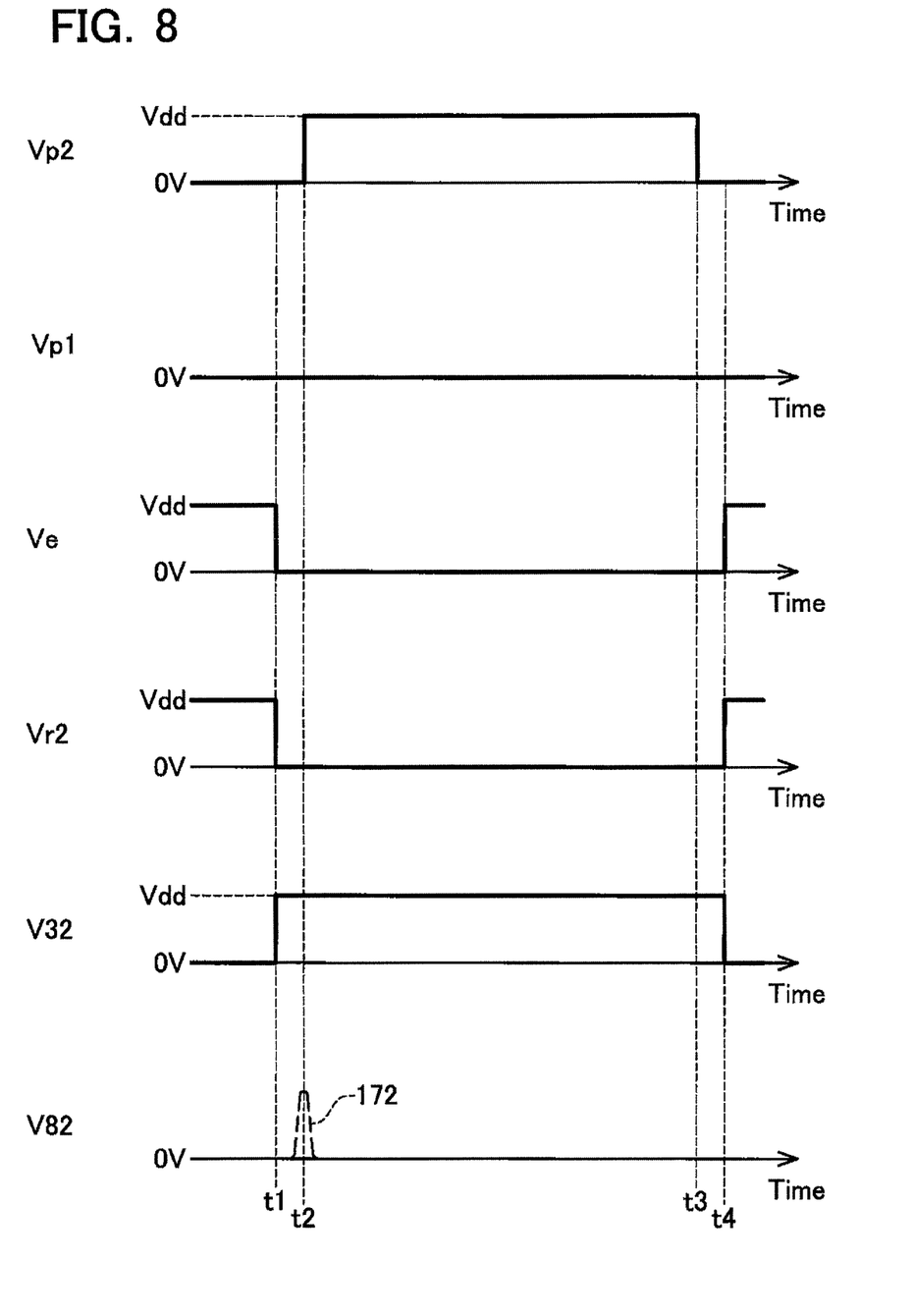
FIG. 8 is a graph showing potentials of components of the semiconductor device 10, a PWM signal Vp2 of the upper-arm IGBT 90, and a potential V82 of the gate 82 in the gate driving circuit for high-speed switching, in the case where the semiconductor device 10 performs the second operation.

Further, in the second operation, the logic circuit 12 inputs the erroneous turn-on preventing signal Ve as it is to each of the gates of the PMOS 18a and the NMOS 18b. Accordingly, in the second operation, as shown in FIG. 8, the signal Vr2 has the same waveform as the erroneous turn-on preventing signal Ve. Since the inverting circuit 18 inverts the input signal Vr2 and outputs the inverted signal to the terminal 32, the signal V32 output to the terminal 32 is a signal obtained by inverting the erroneous turn-on preventing signal Ve.

As described above, the semiconductor device 10 is capable of switching the operation between the first operation in which the signal having the same waveform as the PWM signal Vp1 is output to the terminals 28 and 30, and the signal having the same waveform as the erroneous turn-on preventing signal Ve is output to the terminal 32, and the second operation in which the signal having the waveform obtained by inverting the PWM signal Vp1 is output to the terminals 28 and 30, and the signal obtained by inverting the erroneous turn-on preventing signal Ve is output to the terminal 32.

Figure 2:
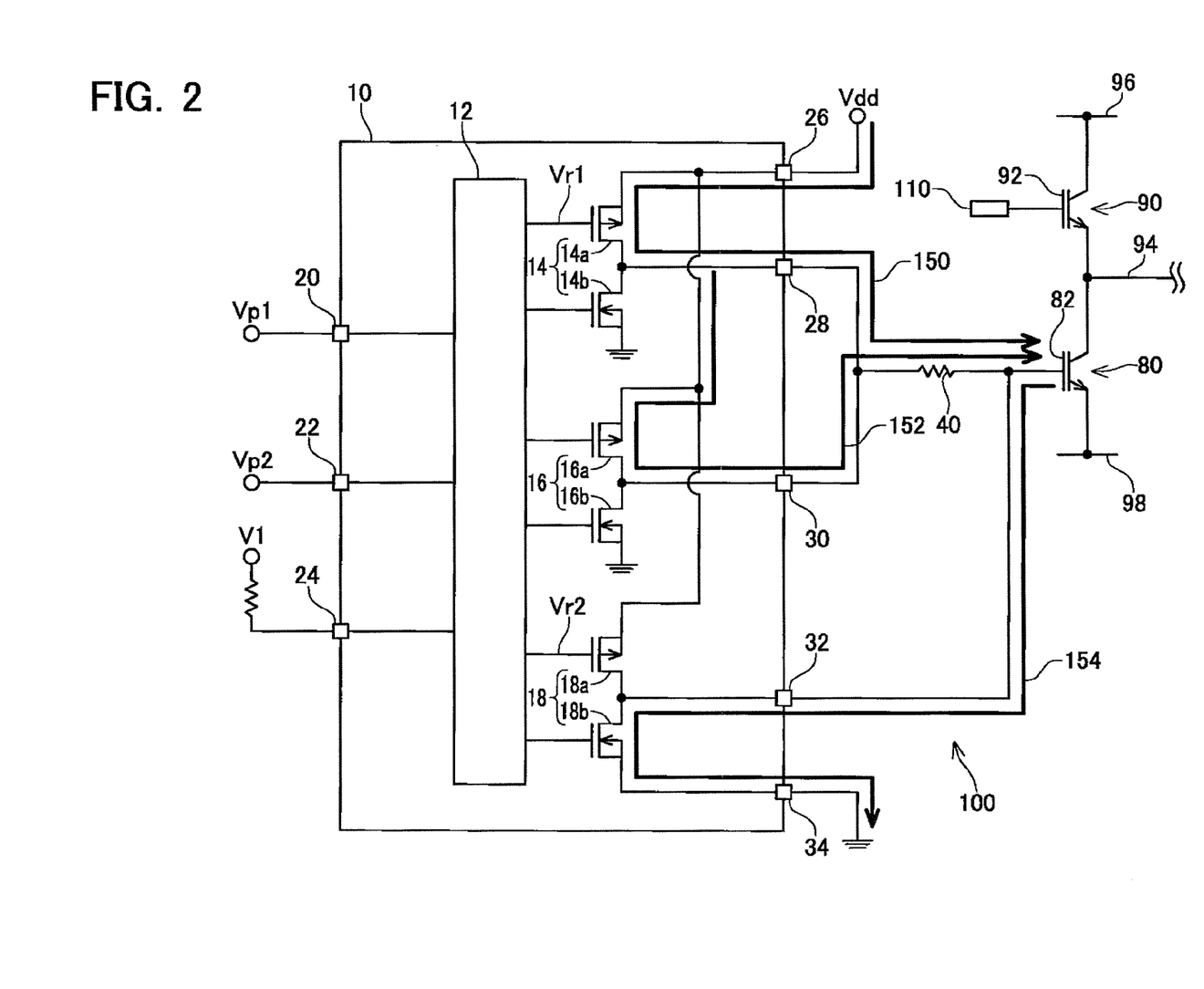
FIG. 2 is a circuit diagram showing a schematic structure of a gate driving circuit 100 for low-speed switching.

Next, a gate driving circuit 100 for low-speed switching, which uses the semiconductor device 10, will be described. IGBTs 80 and 90 shown in FIG. 2 are switching devices included in an inverter circuit. The inverter circuit is a circuit that creates a three-phase AC, and the IGBTs 80 and 90 are switching devices for controlling a current of one of the three phases. A collector of the IGBT 90 is connected to a high potential side wiring 96 of the inverter circuit. An emitter of the IGBT 80 is connected to a low potential side wiring 98 of the inverter circuit. An emitter of the IGBT 90 and a collector of the IGBT 80 are connected to a wiring 94 connected to a motor. The IGBT 90 is a so-called upper-arm IGBT, and the IGBT 80 is a so-called lower-arm IGBT. The IGBTs 80 and 90 repeat switching to control a current at the wiring 94 (i.e., a current that flows to the motor). It is noted that if the IGBTs 80 and 90 are simultaneously turned on, the wiring 96 and the wiring 98 are shorted, and an overcurrent flows in the IGBTs 80 and 90. Accordingly, the IGBTs 80 and 90 are controlled so as not to be simultaneously turned on. The gate driving circuit 100 is connected to a gate 82 of the IGBT 80. Further, a gate driving circuit 110 is connected to a gate 92 of the IGBT 90. Since the gate driving circuit 110 is a circuit for low-speed switching similar to the gate driving circuit 100, detailed description for the gate driving circuit 110 will be omitted in the following description.

In the gate driving circuit 100 for low-speed switching, the semiconductor device 10 is connected as follows. The terminal 20 is connected to a wiring to which the PWM signal Vp1 is applied. The terminal 22 is connected to a wiring to which the PWM signal Vp2 is applied. The PWM signal Vp2 is a signal to control the upper-arm IGBT 90, and is also input to the gate driving circuit 110. The gate driving circuit 110 controls the IGBT 90 based on the PWM signal Vp2. The terminal 24 is connected to a potential V1 higher than the above-described predetermined potential. The terminal 26 is connected to a wiring to which the potential Vdd is applied. The terminals 28 and 30 are connected to the gate 82 of the IGBT 80 via a resistor 40. The resistor 40 has a relatively high electrical resistance. The terminal 32 is connected directly to the gate 82 of the IGBT 80. The terminal 34 is connected to the ground.

In the gate driving circuit 100 for low-speed switching, since the terminal 24 of the semiconductor device 10 is connected to the potential V1 higher than the above-described predetermined potential, the semiconductor device 10 performs the first operation. As described above with reference to FIG. 4, in the first operation, the semiconductor device 10 outputs the signals V28 and V30 having the same waveform as the PWM signal Vp1 to the terminals 28 and 30, respectively. The signals V28 and V30 output to the terminals 28 and 30 are applied to the gate 82 of the IGBT 80 via the resistor 40. That is, when the signals V28 and V30 rise from 0V to the potential Vdd at a timing ta in FIG. 4, gate currents flow through paths indicated by arrows 150 and 152 in FIG. 2, and electrical charges are supplied to the gate 82. Thereby, as shown in FIG. 4, the potential V82 of the gate 82 rises from 0V to the potential Vdd at the timing ta, and the IGBT 80 is turned on. It is noted that since the electrical resistance of the resistor 40 is high, the gate currents 150 and 152 that flow at this time are small. Therefore, the rising speed of the potential V82 shown in FIG. 4 is low. Further, as shown in FIG. 2, the gate currents 150 and 152 pass through the PMOSs 14a and 16a inside the semiconductor device 10, respectively. Although the ampacities of the PMOSs 14a and 16a are small, since the gate currents 150 and 152 are small as described above, no particular problem occurs.

Figure 3:
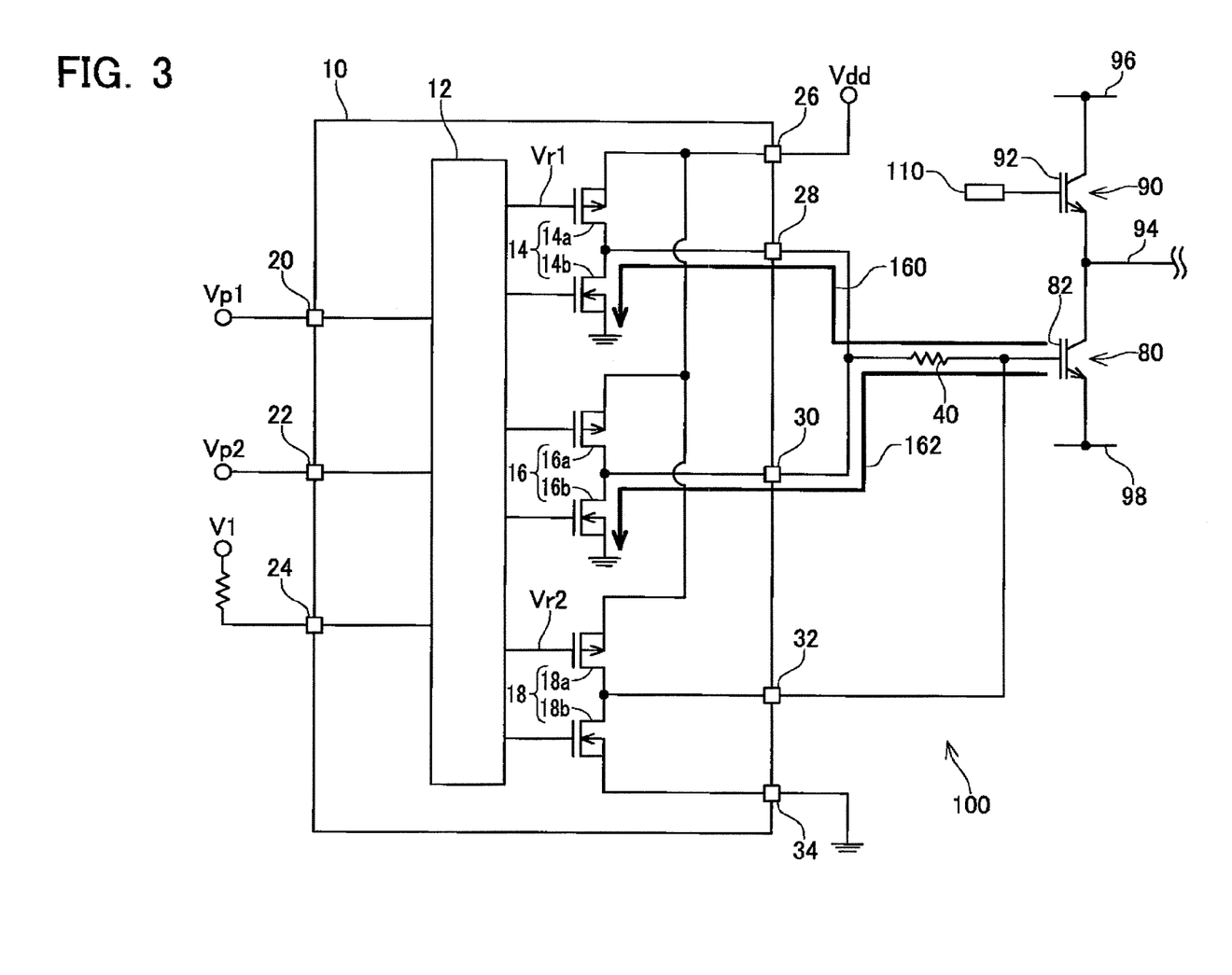
FIG. 3 is a circuit diagram showing a schematic structure of the gate driving circuit 100 for low-speed switching.

Further, when the signals V28 and V30 drop from the potential Vdd to 0V at a timing tb in FIG. 4, gate currents flow through paths indicated by arrows 160 and 162 in FIG. 3, and electrical charges are discharged from the gate 82. Thereby, as shown in FIG. 4, the potential V82 of the gate 82 drops from the potential Vdd to 0V at the timing tb, and the IGBT 80 is turned off. Also in this case, since the electrical resistance of the resistor 40 is high, the gate currents 160 and 162 are small. Accordingly, the dropping speed of the potential V82 shown in FIG. 4 is low. Further, as shown in FIG. 3, the gate currents 160 and 162 pass through the NMOSs 14b and 16b inside the semiconductor device 10, respectively. Although the ampacities of the NMOSs 14b and 16b are small, since the gate currents 160 and 162 are small as described above, no particular problem occurs.

Further, as described above, the semiconductor device 10 creates the erroneous turn-on preventing signal Ve. First, erroneous turn-on of the IGBT 80 which may occur when a circuit for preventing erroneous turn-on is not used, will be described. As described above, the IGBT 80 and the IGBT 90 are controlled so as not to be simultaneously turned on. Further, as described above, while the PWM signal Vp1 is at the potential Vdd, the IGBT 80 is on. Likewise, while the PWM signal Vp2 is at the potential Vdd, the IGBT 90 is on. Therefore, the PWM signal Vp1 and the PWM signal Vp2 are not simultaneously at the potential Vdd. FIG. 5 is an enlarged view showing the potentials of the respective components during a period when one pulse of the PWM signal Vp2 is output (i.e., during a period when the upper-arm IGBT 90 is on). Since the PWM signal Vp1 and the PWM signal Vp2 are not simultaneously at the potential Vdd, the PWM signal Vp1 is at 0V in FIG. 5. When the PWM signal Vp2 rises from 0V to the potential Vdd at a timing t2, the upper-arm IGBT 90 is turned on. Then, the potential of the wiring 96 shown in FIG. 2 is applied to the wiring 94, and the potential of the wiring 94 sharply rises. That is, the potential of the collector of the IGBT 80 sharply rises. Then, due to capacitive coupling between the collector of the IGBT 80 and the gate 82, the potential V82 of the gate 82 also rises. In FIG. 5, this potential rise is indicated by a dashed line 170. It is noted that the gate 82 of the IGBT 80 is connected to the ground by the NMOSs 14b and 16b, since the resistor 40 exists between the gate 82 and the ground, instantaneous rise of the potential of the gate 82 is unavoidable. When the potential V82 of the gate 82 rises in this way, the IGBT 80 is turned on. This is the erroneous turn-on of the IGBT 80. When the erroneous turn-on of the IGBT 80 occurs, the high-potential wiring 96 and the low-potential wiring 98 are shorted, and an overcurrent flows in the IGBTs 80 and 90. The erroneous turn-on preventing signal Ve prevents such erroneous turn-on.

As described above, the erroneous turn-on preventing signal Ve is a signal which drops from the potential Vdd to 0V at the timing t1 immediately before the timing t2 at which the PWM signal Vp2 rises from 0V to the potential Vdd, and rises from 0V to the potential Vdd at the timing t4 immediately after the timing t3 at which the PWM signal Vp2 drops from the potential Vdd to 0V. Further, as described above, in the first operation, when the erroneous turn-on preventing signal Ve is at 0V, the NMOS 181) is on. That is, the NMOS 18b is on during a period from the timing t1 to the timing t4 in FIG. 5, and the gate 82 of the IGBT 80 is directly connected to the ground. Therefore, at the timing t2 when the PWM signal Vp2 rises from 0V to the potential Vdd (i.e., the timing at which the upper-arm IGBT 90 is turned on), the gate 82 is directly connected to the ground. Thereby, the potential V82 of the gate 82 is suppressed from rising from 0V, and is maintained at approximately 0V. Thus, erroneous turn-on of the IGBT 80 is prevented. It is noted that, at the timing when the upper-arm IGBT 90 is turned on, a current flows from the gate 82 to the ground through the NMOS 18b as indicated by an arrow 154 in FIG. 2. This current 154 is a current induced by the potential rise of the wiring 94 (i.e., the collector of the IGBT 80) when the upper-arm IGBT 90 is turned on. In the circuit shown in FIG. 2, the gate driving circuit 110 for the upper-arm IGBT 90 is also a circuit for low-speed switching, like the gate driving circuit 100. Therefore, the switching speed of the IGBT 90 is relatively low, and the rising speed of the potential of the wiring 94 is not so high. Accordingly, the current 154 inducted by the potential rise is not so large. Therefore, even if the current 154 flows in the NMOS 18b having a small ampacity, no particular problem occurs.

As described above, the gate driving circuit 100 for low-speed switching is capable of appropriately switching the IGBT 80, and preventing erroneous turn-on of the IGBT 80. Further, the gate driving circuit 100 does not have a switching device between the semiconductor device 10 and the IGBT 80. Accordingly, the gate driving circuit 100 can be compactly configured.

Figure 6:
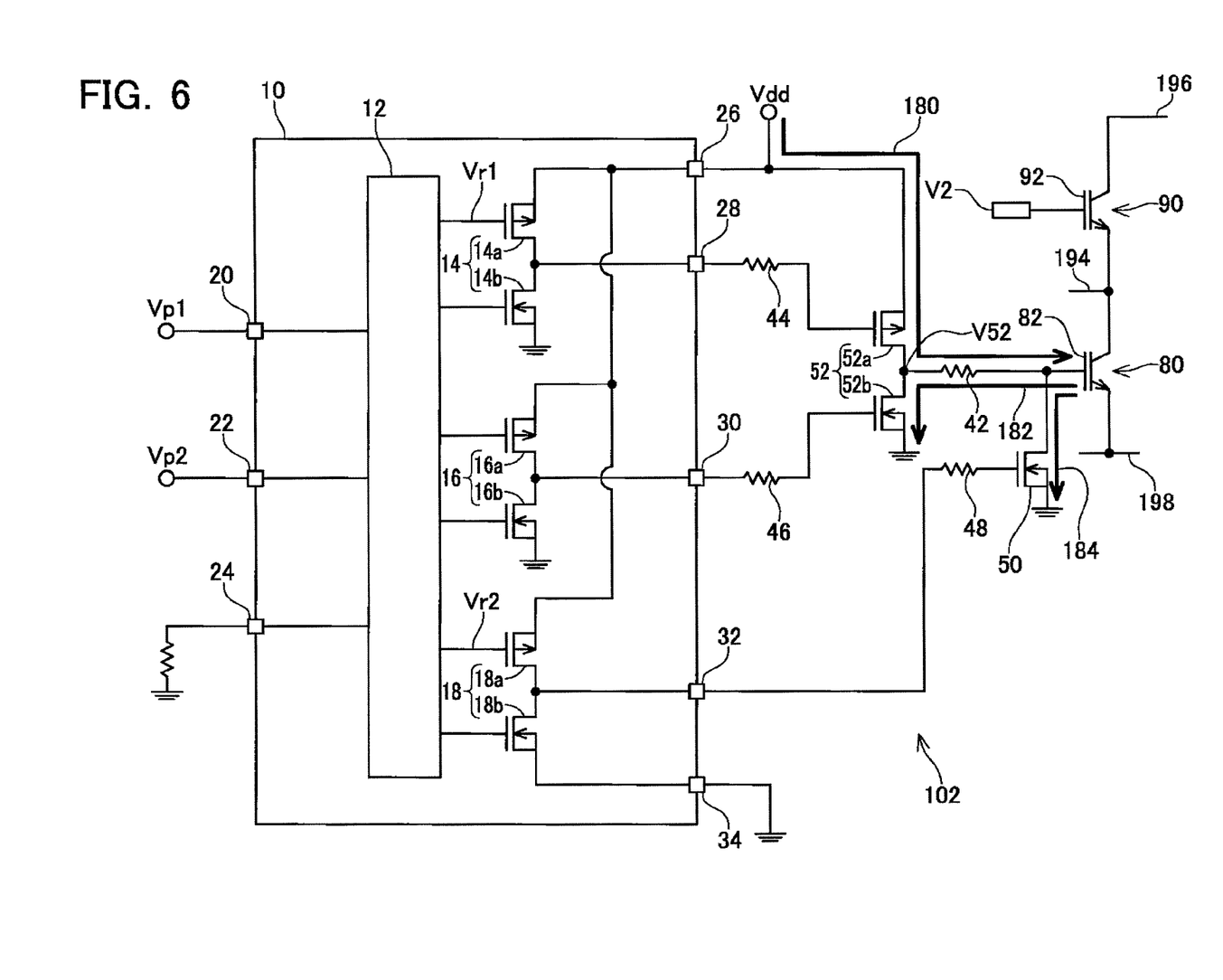
FIG. 6 is a circuit diagram showing a schematic structure of a gate driving circuit 102 for high-speed switching.

Next, a gate driving circuit 102 for high-speed switching, which uses the semiconductor device 10, will be described. IGBTs 80 and 90 shown in FIG. 6 are switching devices included in a DC-DC converter circuit. A collector of the IGBT 90 is connected to a high-potential side wiring 196 of the DC-DC converter circuit. An emitter of the IGBT 80 is connected to a low-potential side wiring 198 of the DC-DC converter circuit. An emitter of the IGBT 90 and a collector of the IGBT 80 are connected to a wiring 194. That is, the IGBT 90 is a so-called upper-arm IGBT, and the IGBT 80 is a so-called lower-arm IGBT. A power supply and a coil are connected in series between the wiring 194 and the wiring 198. The IGBT 90 repeats switching to boost the voltage between the wirings 194 and 198, and applies the voltage between the wirings 196 and 198. The IGBT 80 repeats switching to step down the voltage between the wirings 196 and 198, and applies the voltage between the wirings 194 and 198. It is noted that if the IGBTs 80 and 90 are simultaneously turned on, the wiring 196 and the wiring 198 are shorted, and an overcurrent flows in the IGBTs 80 and 90. Accordingly, the IGBTs 80 and 90 are controlled so as not to be simultaneously turned on. The gate driving circuit 102 is connected to the gate 82 of the IGBT 80. The gate driving circuit 112 is connected to the gate 92 of the IGBT 90. Since the gate driving circuit 112 is a circuit for high-speed switching like the gate driving circuit 102, detailed description of the gate driving circuit 112 will be omitted in the following description.

The gate driving circuit 102 for high-speed switching is configured as follows. The terminal 20 of the semiconductor device 10 is connected to the wiring to which the PWM signal Vp1 is applied. The terminal 22 is connected to the wiring to which the PWM signal Vp2 is applied. The PWM signal Vp2 is a signal to control the upper-arm IGBT 90, and is also input to the gate driving circuit 112. The gate driving circuit 112 controls the IGBT 90 based on the PWM signal Vp2. The terminal 24 is connected to the ground (a potential lower than the predetermined potential). The terminal 26 is connected to the wiring to which the potential Vdd is applied. The terminal 34 is connected to the ground. The gate driving circuit 102 has an inverting circuit 52 and an NMOS 50 outside the semiconductor device 10.

The inverting circuit 52 includes a PMOS 52a and an NMOS 52b. A source of the PMOS 52a is connected to the terminal 26 (i.e., the potential Vdd). A source of the NMOS 52b is connected to the ground. A drain of the PMOS 52a and a drain of the NMOS 52b are connected to the gate 82 of the IGBT 80 via a resistor 42. The electrical resistance of the resistor 42 is lower than that of the resistor 40 (refer to FIG. 2) of the gate driving circuit 100 for low-speed switching. A gate of the PMOS 52a is connected to the terminal 28 via a resistor 44. A gate of the NMOS 52b is connected to the terminal 30 via a resistor 46.

A drain of the NMOS 50 is directly connected to the gate 82 of the IGBT 80. A source of the NMOS 50 is connected to the ground. A gate of the NMOS 50 is connected to the terminal 32 via a resistor 48.

In the gate driving circuit 102 for high-speed switching, since the terminal 24 of the semiconductor device 10 is connected to a potential lower than the above-described predetermined potential, the semiconductor device 10 performs the second operation. As described with reference to FIG. 7, in the second operation, the semiconductor device 10 outputs the signals V28 and V30 obtained by inverting the PWM signal Vp1 to the terminals 28 and 30, respectively. The signal V28 is input to the gate of the PMOS 52a via the resistor 44, and the signal V30 is input to the gate of the NMOS 521) via the resistor 46. When the signals V28 and V30 are at the potential Vdd, the PMOS 52a is off and the NMOS 52b is on. Therefore, the output potential V52 (refer to FIG. 6) of the inverting circuit 52 is 0V. On the other hand, when the signals V28 and V30 are at 0V, the PMOS 52a is on and the NMOS 52b is off. Therefore, the output potential V52 of the inverting circuit 52 is the potential Vdd. Accordingly, the output signal V52 of the inverting circuit 52 is a signal obtained by inverting the signals V28 and V30 as shown in FIG. 7. That is, the output signal V52 has the same waveform as the PWM signal Vp1. The signal V52 is input to the gate 82 of the IGBT 80 via the resistor 42.

When the signal V52 rises from 0V to the potential Vdd at a timing ta, a gate current flows through a path indicated by an arrow 180 in FIG. 6, and electric charges are supplied to the gate 82. Thereby, as shown in FIG. 7, the potential V82 of the gate 82 rises from 0V to the potential Vdd at the timing ta, and the IGBT 80 is turned on. It is noted that since the electrical resistance of the resistor 42 is low, the gate current 180 that flows at this time is large. Accordingly, the rising speed of the gate potential V82 shown in FIG. 7 is high. Further, as shown in FIG. 6, the gate current 180 passes through the PMOS 52a of the inverting circuit 52. The PMOS 52a is a PMOS provided outside the semiconductor device 10, and therefore, has a large ampacity. Accordingly, even when the large gate current 180 flows, no particular problem occurs.

Further, when the signal V52 drops from the potential Vdd to 0V at a timing tb in FIG. 7, a gate current flows through a path indicated by an arrow 182 in FIG. 6, and electric charges are discharged from the gate 82. Thereby, as shown in FIG. 7, the potential V82 of the gate 82 drops from the potential Vdd to 0V at the timing tb, and the IGBT 80 is turned off. Also in this case, since the electrical resistance of the resistor 42 is low, the gate current 182 is large. Accordingly, the dropping speed of the potential V82 shown in FIG. 7 is high. Further, as shown in FIG. 6, the gate current 182 passes through the NMOS 52b of the inverting circuit 52. The NMOS 52b is an NMOS provided outside the semiconductor device 10, and therefore, has a large ampacity. Accordingly, even when the large gate current 182 flows, no particular problem occurs.

Next, prevention of erroneous turn-on in the gate driving circuit 102 for high-speed switching will be described. It is noted that erroneous turn-on that occurs in a DC-DC converter is a phenomenon that occurs on the same principle as the above-described erroneous turn-on of the inverter circuit. That is, the IGBT 90 is turned on, and the potential of the wiring 194 rises, and thereby the potential of the gate 82 rises to turn on the IGBT 80. As described above with reference to FIG. 8, in the second operation, the semiconductor device 10 outputs, to the terminal 32, the signal V32 obtained by inverting the erroneous turn-on preventing signal Ve. The signal V32 is input to the gate of the NMOS 50. The NMOS 50 is on while the signal V32 is at the potential Vdd, and is off while the signal Vdd is at 0V. When the NMOS 50 is on, the gate 82 of the IGBT 80 is directly connected to the ground. That is, during a period from a timing t1 to a timing t4 shown in FIG. 8, the NMOS 50 is on, and the gate 82 of the IGBT 80 is directly connected to the ground. Thereby, rise of the potential V82 as indicated by a dashed line 172 in FIG. 8 is suppressed, and the potential V82 is maintained at approximately 0V. That is, erroneous turn-on of the IGBT 80 is prevented. Further, at a timing when the upper-arm IGBT 90 is turned on (i.e., timing t2 in FIG. 8), a current flows from the gate 82 toward the ground as indicated by an arrow 184 in FIG. 6. This current 184 flows in the NMOS 50. Further, the gate driving circuit 112 for the IGBT 90 is a circuit for high-speed switching like the gate driving circuit 102. Accordingly, the switching speed of the IGBT 90 is high. Therefore, the rising speed of the potential of the wiring 194 when the IGBT 90 is turned on is high. Accordingly, the current 184 induced by this potential rise is large. However, the NMOS 50 is an NMOS provided outside the semiconductor device 10, and therefore, can secure a large ampacity. Accordingly, even when the large current 184 flows in the NMOS 50, no particular problem occurs.

As described above, the gate driving circuit 102 for high-speed switching is capable of appropriately switching the IGBT 80 without causing a problem in terms of the ampacity, and preventing erroneous turn-on of the IGBT 80. Furthermore, the gate driving circuit 102 inverts the signal output from the semiconductor device 10 just one time, and inputs the inverted signal to the gate 82. Therefore, in the gate driving circuit 102, only the switching device for securing the ampacity exists between the semiconductor device 10 and the IGBT 80. Accordingly, the gate driving circuit 102 is not increased in size, and the gate driving circuit 102 can be configured so as to have a practical size.

As described above, the semiconductor device 10 is capable of performing the first operation, and the second operation in which a signal obtained by inverting a signal to be output in the first operation is output. Therefore, the semiconductor device 10 can be shared between the gate driving circuit for high-speed switching and the gate driving circuit for low-speed switching.

It is noted that, in the above-described semiconductor device 10, the logic circuit 12 needs to include a circuit for switching between the first operation and the second operation. However, since, in the logic circuit 12, signals are treated at an extremely low current level, each of devices used in the switching circuit may have an extremely small ampacity. Therefore, even if such a switching circuit is incorporated in the semiconductor device 10, the size of the semiconductor device 10 is almost the same as the size of the conventional semiconductor device (the semiconductor device incapable of switching between the first operation and the second operation).

In the above embodiment, the semiconductor device 10 includes two inverting circuits 14 and 16. This is for the purpose of increasing the ampacity of the semiconductor device 10 by securing a plurality of current paths (e.g., the paths 150 and 152 shown in FIG. 2, or the paths 160 and 162 shown in FIG. 3) in the gate driving circuit 100 for low-speed switching. However, if a single current path can provide a sufficiently large ampacity of the semiconductor device 10, a plurality of current paths need not be secured.

Further, in the above embodiment, the erroneous turn-on preventing signal Ve is maintained at 0V while the upper-arm IGBT 90 is on, and thereby the gate 82 of the IGBT 80 is directly connected to the ground. This is for the purpose of preventing the potential of the gate 82 from rising due to coupling from the collector of the IGBT 80 because the collector is at a high potential while the IGBT 90 is on. However, the coupling from the collector causes a problem mostly at the timing t2 when the IGBT 90 is turned on. Therefore, the IGBT 80 needs to be directly connected to the ground at least at the timing t2 when the IGBT 90 is turned on.

Further, in the above embodiment, the signal Ve is created inside the semiconductor device 10. However, the signal Ve created outside the semiconductor device 10 may be input to the semiconductor device 10.

Further, in the above embodiment, the semiconductor device 10 performs the first operation by using the gate driving circuit 100 for low-speed switching, and performs the second operation by using the gate driving circuit 102 for high-speed switching. However, when using, as the PWM signal Vp1 and the erroneous turn-on preventing signal Ve, signals obtained by inverting these signals, the semiconductor device 10 may perform the second operation by using the gate driving circuit 100 for low-speed switching, and perform the first operation by using the gate driving circuit 102 for high-speed switching.

Further, in the above embodiment, the semiconductor device 10 outputs the signals of the same waveforms as the PWM signal Vp1 and the erroneous turn-on preventing signal Ve, and the signals obtained by inverting these signals. In addition, the semiconductor device 10 may perform amplification of the PWM signal Vp1 and the erroneous turn-on preventing signal Ve.

Finally, correspondence between the above embodiment and claims will be described. The PWM signal Vp1 of the embodiment corresponds to a reference signal in claims. The signals V28 and V30 in the first operation of the embodiment correspond to, in claims, a signal output to a first signal output terminal in a first operation. The signals V28 and V30 in the second operation of the embodiment correspond to, in claims, a signal output to the first signal output terminal in a second operation. The erroneous turn-on preventing signal Ve in the embodiment may be regarded as the reference signal in claims. In this case, the signal V32 in the first operation of the embodiment corresponds to, in claims, the signal output to the first signal output terminal in the first operation, and the signal V32 in the second operation of the embodiment corresponds to, in claims, the signal output to the first signal output terminal in the second operation.

While specific embodiments have been described in detail, these embodiments are for illustrative purposes only and are not intended to limit the scope of the following claims. The techniques described in the claims include various modifications and changes made to the specific embodiments illustrated above. The technical elements described in this specification or in the drawings exhibit technical utility singly or in various combinations and are not limited to the combinations recited in the claims as filed. Moreover, the techniques illustrated in this specification or in the drawings simultaneously attain a plurality of purposes, and attaining one of the purposes per se offers technical utility.

The invention claimed is:

1. A circuit for controlling a potential of a gate of an insulated gate type switching device, the circuit comprising:
a semiconductor device comprising a first signal output terminal, and configured to output a signal to control a potential of a gate of an insulated gate type switching device;
an inverting circuit connected to the first signal output terminal, and configured to invert the signal output to the first signal output terminal and to output the inverted signal;
a first insulated gate type switching device including a gate that is connected the inverting circuit and receives the inverted signal output from the inverting circuit;
a second insulated gate type switching device connected to the first insulated gate type switching device in series; and
a low potential wiring being at a potential lower than an average potential of the signal output from the inverting circuit;
wherein
the semiconductor device is capable of receiving a reference signal or internally creating the reference signal,
the semiconductor device is capable of switching between a first operation and a second operation, the first operation outputs to the first signal output terminal a signal that is at a third potential when the reference signal is at a first potential, and that is at a fourth potential higher than the third potential when the reference signal is at a second potential, and the second operation outputs to the first signal output terminal a signal that is at the fourth potential when the reference signal is at the first potential, and that is at the third potential when the reference signal is at the second potential,
the semiconductor device is set to work under only one of the first operation or the second operation,
the semiconductor device comprises a first signal creating circuit configured to create the signal to be output to the first signal output terminal,
the first signal creating circuit comprises a first switching device,
the inverting circuit comprises a second switching device,
an ampacity of the second switching device is larger than an ampacity of the first switching device,
the circuit further comprises a third switching device connected between a gate of the first insulated gate type switching device and the low potential wiring,
the semiconductor device further comprises a second signal output terminal and the second signal creating circuit, the second signal output terminal is connected to the third switching device, and the second signal creating circuit is configured to create a signal to be output to the second signal output terminal,
the third switching device is configured to switch according to the signal output to the second signal output terminal,
the second signal creating circuit comprises a fourth switching device and configured to create the signal so that the third switching device is turned on at least at a moment when the second insulated gate type switching device switches from off to on, and an ampacity of the third switching device is larger than an ampacity of the fourth switching device.

* * * * *